United States Patent
Hsu et al.

(10) Patent No.: US 7,813,208 B2
(45) Date of Patent: *Oct. 12, 2010

(54) MOTHERBOARD WITH VOLTAGE REGULATOR FOR SUPPORTING DDR2 MEMORY MODULES AND DDR3 MEMORY MODULES

(75) Inventors: Shou-Kuo Hsu, Taipei Hsien (TW); Duen-Yi Ho, Taipei Hsien (TW); Cheng-Shien Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 265 days.

This patent is subject to a terminal disclaimer.

(21) Appl. No.: 11/965,753

(22) Filed: Dec. 28, 2007

(65) Prior Publication Data
US 2009/0103385 A1   Apr. 23, 2009

(30) Foreign Application Priority Data
Oct. 19, 2007 (CN) .......................... 2007 1 0202157

(51) Int. Cl.
*G11C 5/14* (2006.01)
(52) U.S. Cl. .......................... 365/226; 365/51; 365/149; 365/233.13; 710/10
(58) Field of Classification Search .................. 365/51, 365/149, 226, 233.13; 710/10
See application file for complete search history.

(56) References Cited

U.S. PATENT DOCUMENTS

| | | | | |
|---|---|---|---|---|
| 6,298,426 B1 * | 10/2001 | Ajanovic | ..................... | 711/172 |
| 6,498,759 B2 * | 12/2002 | Chang et al. | ................. | 365/226 |
| 6,516,381 B1 * | 2/2003 | Hamilton et al. | ............ | 711/105 |
| 6,681,286 B2 * | 1/2004 | Chang et al. | ................. | 710/316 |
| 7,327,612 B2 * | 2/2008 | Bacchus et al. | ........ | 365/189.011 |
| 7,545,700 B2 * | 6/2009 | Chen et al. | ................... | 365/226 |
| 2008/0225499 A1 * | 9/2008 | Meng et al. | ................. | 361/767 |
| 2009/0086561 A1 * | 4/2009 | Hsu et al. | .................... | 365/226 |

* cited by examiner

*Primary Examiner*—VanThu Nguyen
*Assistant Examiner*—Alexander Sofocleous
(74) *Attorney, Agent, or Firm*—Frank R. Niranjan

(57) ABSTRACT

An exemplary motherboard includes a driving module, at least two first slots arranged for mounting two first type of memories, at least two second slots arranged for mounting two second type of memories, and a voltage regulator. The driving module is electronically connected to the at least two first slots, the at least two second slots, and the voltage regulator in turn via a channel. The first type of memories and the second type of memories are alternatively mounted on the motherboard, the voltage regulator detects which type memory is currently mounted on the motherboard and outputs voltages suitable for the type of memory mounted on the motherboard accordingly.

8 Claims, 3 Drawing Sheets

MOTHERBOARD WITH VOLTAGE REGULATOR FOR SUPPORTING DDR2 MEMORY MODULES AND DDR3 MEMORY MODULES

CROSS-REFERENCES TO RELATED APPLICATION

Relevant subject matter is disclosed in a co-pending U.S. patent application with application Ser. No. 11/766,105, filed on Jun. 21, 2007, and entitled "MOTHERBOARD", which is assigned to the same assignee as this patent application.

BACKGROUND

1. Field of the Invention

The present invention relates to motherboards, and particularly to a motherboard for supporting different types of memories.

2. Description of Related Art

Currently, a typical personal computer comprises a motherboard, interface cards, and peripheral accessories. The motherboard is the heart of the personal computer. On the motherboard, in addition to the central processing unit (CPU), the chip set, and the slots for installing the interface cards, it further includes memory module slots for installing memory modules.

Due to constant change in the computer industry, memories used in the computer have changed from DDR2 (Double Data Ram II) used in the past to higher speed memories such as DDR3 (Double Data Ram III).

Because DDR2 is cheaper than DDR3, the main board with DDR2 still is in demand in the market. The difference in operating DDR2 and DDR3 includes: DDR2 utilizes 1.8V VDD and 0.9V VTT, while DDR3 utilizes 1.5V VDD and 0.75V VTT. Currently, no motherboard is compatible with both DDR3 and DDR2. As a result, more motherboards have to be fabricated adding to production cost.

What is needed is to provide a motherboard capable of flexibly supporting different types of memories.

SUMMARY

An exemplary motherboard includes a driving module, at least two first slots arranged for mounting two first type of memories, at least two second slots arranged for mounting two second type of memories, and a voltage regulator. The driving module is electronically connected to the at least two first slots, the at least two second slots, and the voltage regulator in turn via a channel. The first type of memories and the second type of memories are alternatively mounted on the motherboard, the voltage regulator detects which type memory is currently mounted on the motherboard and outputs voltages suitable for the type of memory mounted on the motherboard accordingly.

Other advantages and novel features of the present invention will become more apparent from the following detailed description of preferred embodiment when taken in conjunction with the accompanying drawings, in which:

DETAILED DESCRIPTION

Figure 1:
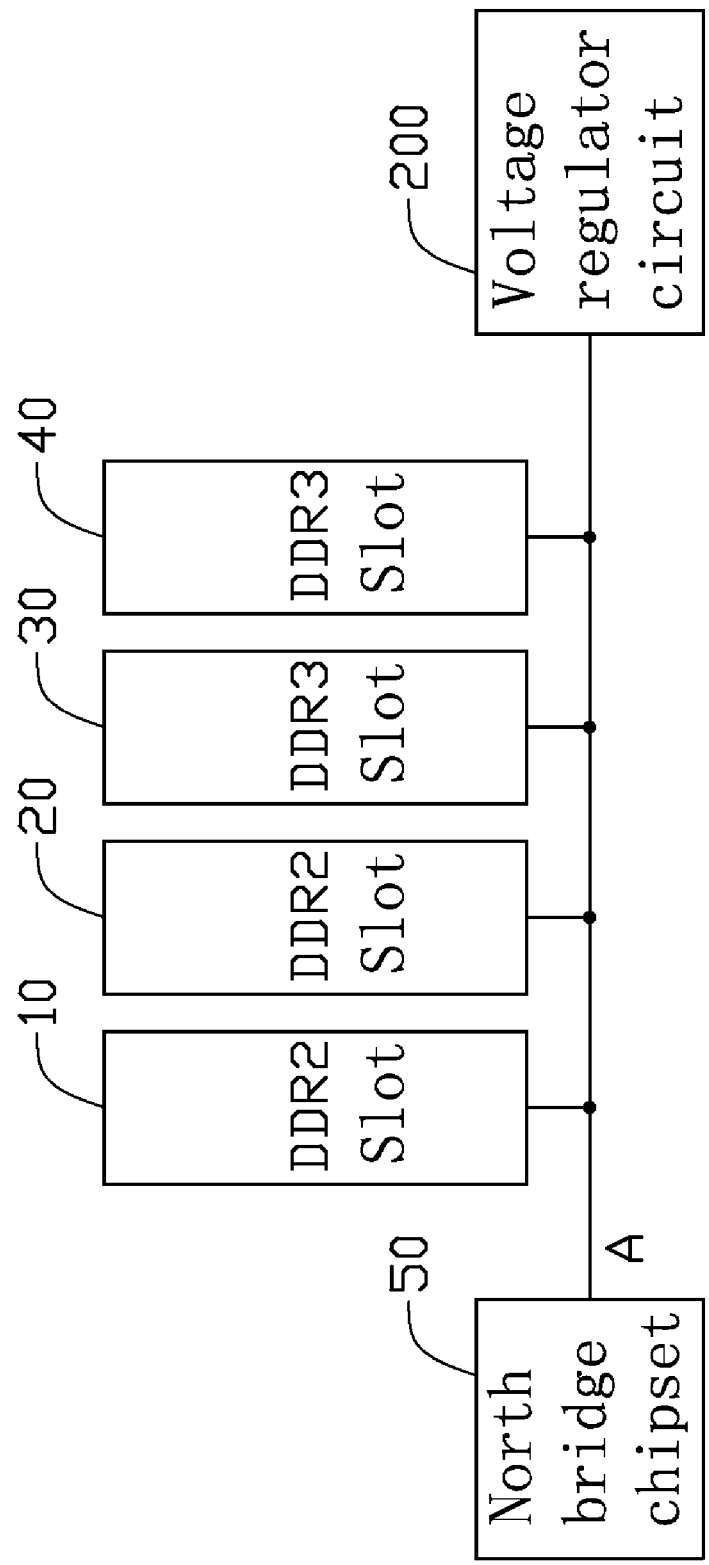
FIG. 1 is a schematic view of a motherboard for supporting different types of memories in accordance with a first embodiment of the present invention having four slots and a voltage regulator.

Referring to FIG. 1, a motherboard for supporting different types of memories in accordance with a first embodiment of the present invention includes a driving module 50 such as a north bridge chipset, two DDR2 slots 10, 20, two DDR3 slots 30, 40 and a voltage regulator 200, arranged in that order. The DDR2 slots 10, 20 are used for installing two first type of memories, such as two DDR2 memories. The DDR3 slots 30, 40 are used for installing two second type of memories, such as two DDR3 memories. The north bridge chipset 50 is connected to the two DDR2 slots 10, 20, the two DDR3 slots 30, 40, and the voltage regulator 200 in turn via a channel A.

Figure 2:
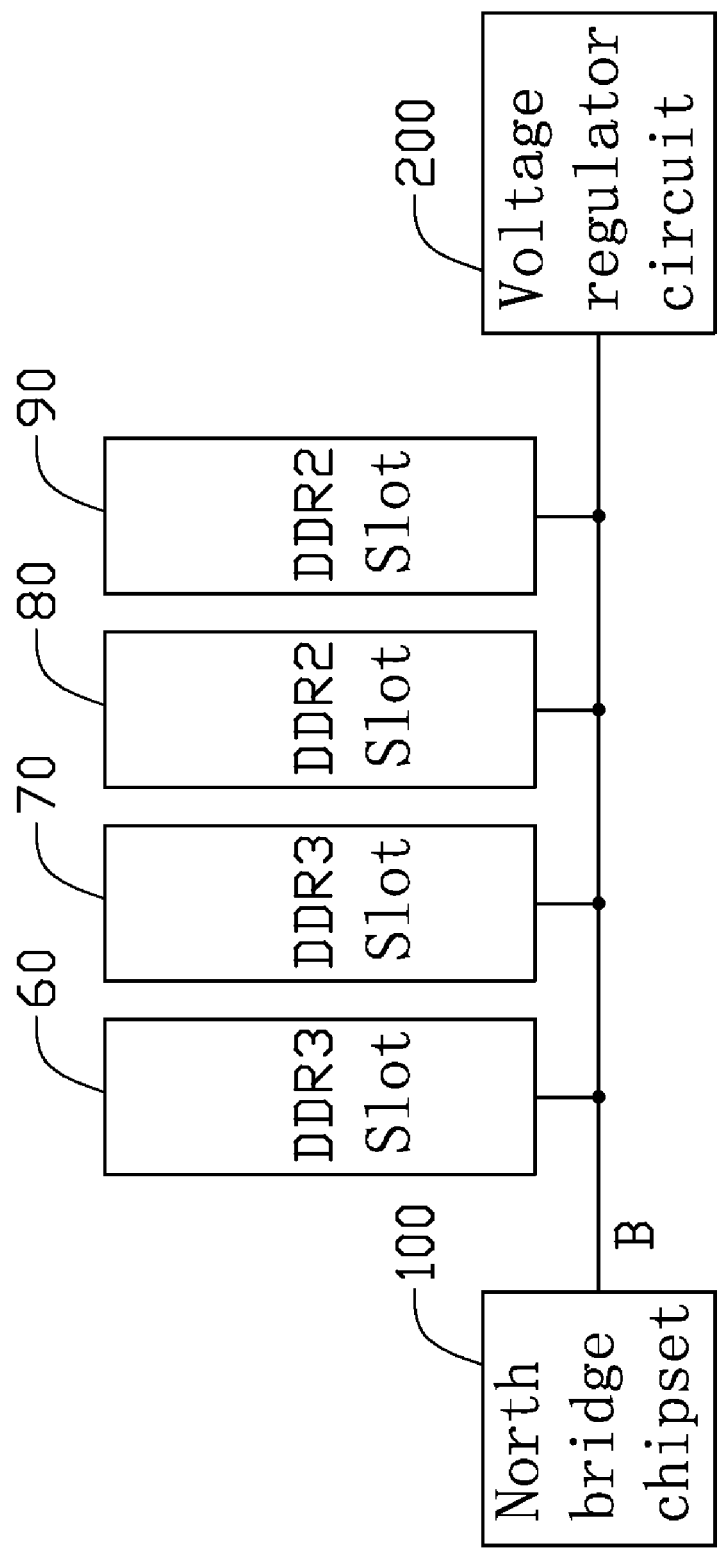
FIG. 2 is a schematic view of a motherboard for supporting different types of memories in accordance with a second embodiment of the present invention having four slots and a voltage regulator.

Referring to FIG. 2, a motherboard for supporting different types of memories in accordance with a second embodiment of the present invention includes a north bridge chipset 100, two DDR3 slots 60, 70, and two DDR2 slots 80, 90 and a voltage regulator 200, arranged in that order. The DDR3 slots 60, 70 are used for installing two second type of memories, such as two DDR3 memories. The DDR2 slots 80, 90 are used for installing two first type of memories, such as two DDR2 memories. The north bridge chipset 100 is connected to the two DDR3 slots 60, 70, the two DDR2 slots 80, 90, and the voltage regulator 200 in turn via a channel B.

The first type of memories and the second type of memories are alternatively mounted on the motherboard. The voltage regulator 200 provides working voltage for the DDR2 slots or the DDR3 slots according to different types of memories mounted on the motherboard. In the practice, the DDR2 slots and the DDR3 slots may be arranged in a plurality ways. The signal rise time is indicated for each possible arrangement along with an indication of having non-monotonic characteristic or not in the table below:

| Slots array manner | North bridge chipset DDR2 Slot DDR2 Slot DDR3 Slot DDR3 Slot | North bridge chipset DDR2 Slot DDR3 Slot DDR2 Slot DDR3 Slot | North bridge chipset DDR2 Slot DDR3 Slot DDR3 Slot DDR2 Slot | North bridge chipset DDR3 Slot DDR2 Slot DDR2 Slot DDR3 Slot | North bridge chipset DDR3 Slot DDR2 Slot DDR3 Slot DDR2 Slot | North bridge chipset DDR3 Slot DDR3 Slot DDR2 Slot DDR2 Slot |
|---|---|---|---|---|---|---|
| Signal rise time(ns) | 0.667 | 1.159 | 0.616 | 1.150 | 0.716 | 0.597 |
| Non-monotonic | No | Yes | Yes | No | Yes | No |

According to the table, the direction of the arrowhead represents the alignment order of the DDR2 and DDR3 slots. The signal rise times using the motherboards in accordance with the first and second embodiments of the present invention are respectively 0.667 ns and 0.597 ns, and do not have a non-monotonic characteristic during signal transmission, so the two embodiments are the two optimal choice.

Figure 3:
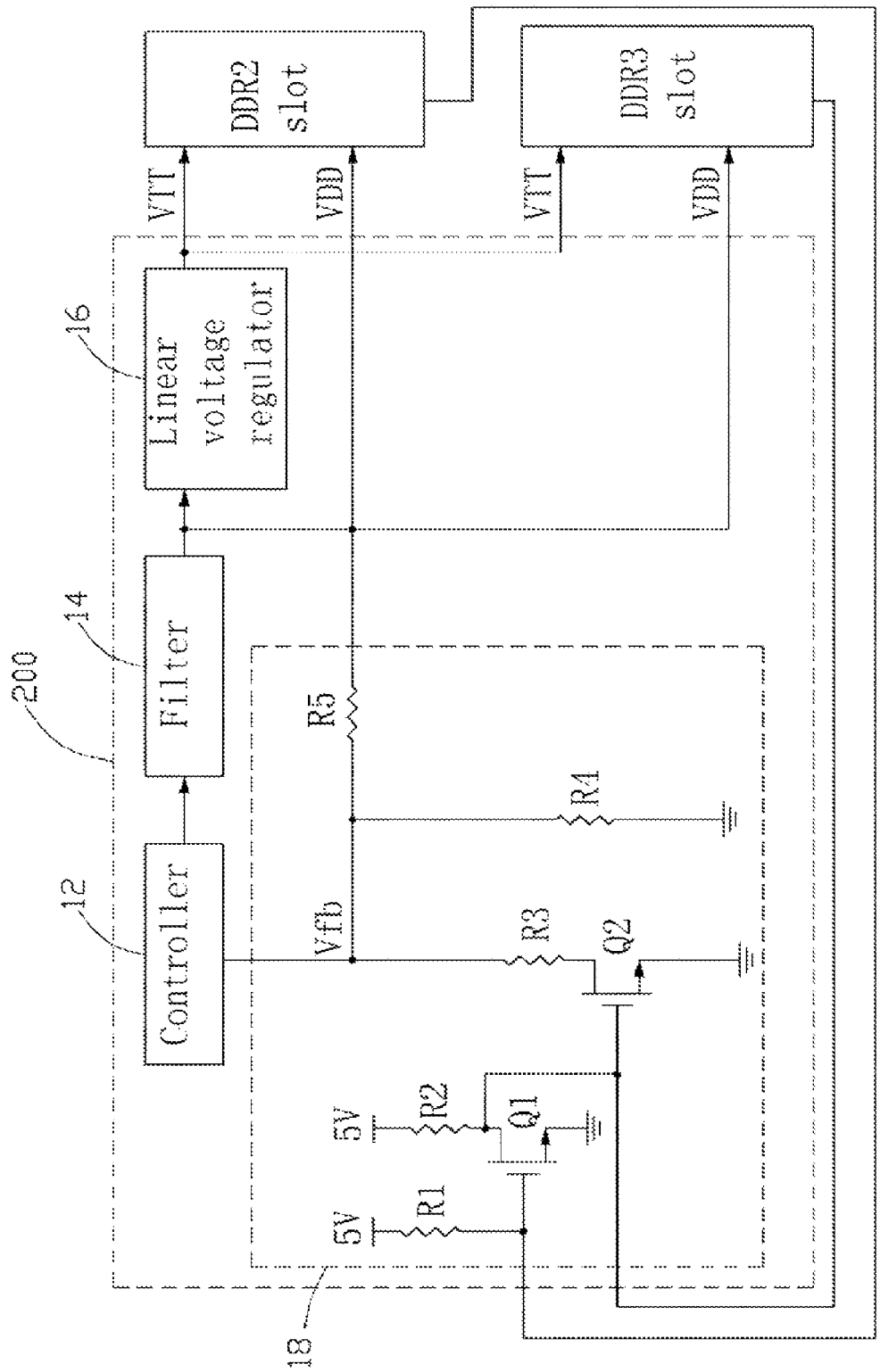
FIG. 3 is a circuit diagram of the voltage regulator of FIG. 1 and FIG. 2.

Referring to FIG. 3, the voltage regulator 200 comprises a controller 12 having a feedback terminal and an output terminal, a filter 14 having an input terminal and an output terminal, a linear voltage regulator 16, and a feedback circuit 18. The output of the controller 12 is connected to the input terminal of the filter 14, and the filter 14 outputs a VDD voltage at the output terminal thereof. The VDD voltage is transmitted to the linear voltage regulator 16, and is converted into a VTT voltage transmitted to the DDR2 slots and the DDR3 slots. The output terminal of the filter 14 is connected to the DDR2 slots and the DDR3 slots to provide the VDD voltage.

The feedback circuit 18 comprises two transistors Q1 and Q2, four resistors R1~R4, and a feedback resistor R5. The transistors Q1 and Q2 are PMOS transistors. The gate of the transistor Q1 is connected to ground terminals of the DDR2 slots and to a 5V power source via the resister R1. The source of the transistor Q1 is grounded. The drain of the transistor Q1 is connected to the 5V power source via the resistor Q2 and to the gate of the transistor Q2. The gate of the transistor Q2 is connected to ground terminals of the DDR3 slots. The source of the transistor Q2 is grounded. The drain of the transistor Q2 is grounded via the resistors R3 and R4 in turn and also connected to the feedback terminal of the controller 12 via the resistor R3. The feed back resistor R5 is connected between the output terminal of the filter 14 and the feedback terminal of the controller 12. The resistances of the resistors R1~R4 are approximately 4.7 Kohms, 4.7 Kohms, 2.4 Kohms, and 1.2 Kohms respectively, and the resistance of the feedback resistor R5 is approximately 1.1 Kohms. The operation of the feedback circuit 18 is premised upon the fact that the level of the feedback voltage Vfb is stable, in this preferred embodiment, the level of the feedback voltage Vfb is 0.78V.

When the DDR2 memories are mounted in the DDR2 slots, the DDR3 slots are idle. The ground terminals of the DDR2 slots generate a ground signal. The transistor Q1 is turned on, and the transistor Q2 is turned off. According to the following formula: VDD=Vfb*(R5+R4)/R4, the voltage output from the controller 12 is 1.8V. The voltage is provided to the filter 14, which filters and rectifies the voltage to provide a smooth voltage output. The VDD is provided to the feedback circuit 18 and the DDR2 memories mounted in the DDR2 slots. The linear voltage regulator 16 is configured to receive the VDD voltage and provide a regulated output voltage of VTT (0.9V), which is provided to the DDR2 memories.

When the DDR3 memories are mounted in the DDR3 slots, the DDR2 slots are idle. The ground terminals of the DDR3 slots generate the ground signal. The transistor Q1 is turned off, the transistor Q2 is turned on, and the resistor R3 is connected in the circuit. According to the following formula: VDD=Vfb*(R5+Rx)/Rx, wherein Rx=(R3+R4)/R3*R4, the voltage output from the controller 12 is 1.5V. The voltage is provided to the filter 14, which filters and rectifies the voltage to provide a smooth voltage output. The VDD is provided to the feedback circuit 18 and the DDR3 memories mounted in the DDR3 slots. The linear voltage regulator 16 is configured to receive the VDD voltage and provide a regulated output voltage of VTT (0.75V), which is provided to the DDR3 memories.

Thus, the motherboard is capable of utilizing either the DDR2 or the DDR3, thus enhancing production capability and reducing production cost.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A motherboard for supporting different types of memories, comprising:
    a driving module;
    at least two first slots arranged for mounting two first type of memories and connected to the driving module via a channel, wherein the two first type of memories are adjacent to each other, each first slot comprises a ground terminal generating a ground signal when the first type of memory is mounted therein;
    at least two second slots arranged for mounting two second type of memories and connected to the driving module via the channel, wherein the two second type of memories are adjacent to each other, each second slot comprises a ground terminal generating the ground signal when the second type of memory is mounted therein, and the first type of memories and the second type of memories are alternatively mounted on the motherboard; and
    a voltage regulator connected to the driving module via the channel to detect which type of memory is mounted on the motherboard, and output voltages suitable for the detected type of memory mounted on the motherboard, the voltage regulator comprising:
        a feedback circuit receiving the ground signal from the ground terminal of the first slot or the second slot and outputting a constant feedback voltage according to the ground signal;
        a controller comprising a feedback terminal to receive the constant feedback voltage and convert the constant feedback voltage to a first voltage, and an output terminal to output the first voltage to the first slot or the second slot; and
        a linear voltage regulator comprising an input terminal to receive the first voltage from the output terminal of the controller and convert the first voltage to a second voltage, and an output terminal to output the second voltage to the first slot or the second slot.

2. The motherboard as claimed in claim 1, wherein the two first slots are DDR2 slots, and the two second slots are DDR3 slots.

3. The motherboard as claimed in claim 2, wherein the at least two first slots and the at least two second slots are connected to the channel in turn, and the at least two first slots are closer to the driving module than the at least two second slots.

4. The motherboard as claimed in claim 2, wherein the at least two second slots and the at least two first slots are connected to the channel in turn, and the at least two second slots are closer to the driving module than the at least two first slots.

5. The motherboard as claimed in claim 2, wherein the voltage regulator comprises:

a filter comprising an input terminal connected to the output terminal of the controller to receive the first voltage from the controller, and an output terminal connected to the DDR2 slots and the DDR3 slots to provide the first voltage to the DDR2 slots and the DDR3 slots via filtering, a feedback resistor is connected between the output terminal of the filter and the feedback terminal of the controller; and the feedback circuit comprising a first transistor and a second transistor, the gate of the first transistor connected to ground terminals of the DDR2 slots and to a power source via a first resistor, the source of the first transistor grounded, the drain of the first transistor connected to the power source via a second resistor and to the gate of the second transistor, the gate of the second transistor also connected to ground terminals of the DDR3 slots, the source of the second slot grounded, the drain of the second transistor grounded via a third resistor and a fourth resistor in turn and also connected to the feedback terminal of the controller via the third resistor.

6. The motherboard as claimed in claim 5, wherein the first transistor and the second transistor are PMOS transistors.

7. The motherboard as claimed in claim 5, wherein the resistances of the first to the fourth resistors are approximately 4.7 Kohms, 4.7 Kohms, 2.4 Kohms, and 1.2 Kohms respectively, and the resistance of the feedback resistor is approximately 1.1 Kohms.

8. The motherboard as claimed in claim 5, wherein a feedback voltage at the feedback terminal of the controller is 0.78V.

* * * * *